United States Patent

Alsmeier et al.

[11] Patent Number: 6,054,345
[45] Date of Patent: Apr. 25, 2000

[54] METHOD FOR FORMING DEEP DEPLETION MODE DYNAMIC RANDOM ACCESS MEMORY (DRAM) CELL

[75] Inventors: Johann Alsmeier, Falls, N.Y.; Reinhard Johannes Stengl, Stadtbergen, Germany

[73] Assignee: Siemens Aktiengesellschaft, Munich, Germany

[21] Appl. No.: 08/833,557

[22] Filed: Apr. 7, 1997

Related U.S. Application Data

[62] Division of application No. 08/556,522, Nov. 13, 1995, abandoned.

[51] Int. Cl.[7] ................................................. H01L 21/8242
[52] U.S. Cl. ........................ 438/238; 438/267; 438/303
[58] Field of Search ..................................... 438/238–242, 438/250–256, 381, 393–399, 275, 257–258, 266–267, 303

[56] References Cited

U.S. PATENT DOCUMENTS 5,565,372  10/1996  Kim .
5,672,532   9/1997  Hsue et al. .

Primary Examiner—Jey Tsai
Attorney, Agent, or Firm—Donald B. Paschburg

[57] ABSTRACT

A semiconductor memory device for receiving a charge, includes a substrate, a transfer gate overlying the substrate, a storage device coupled to the transfer gate, a deep depleted region formed in the substrate under the storage means, and a bit line for initially receiving the charge and the substrate receiving the charge via the transfer gate. The substrate is highly resistive in a deep depletion mode, if no charge is stored therein, and has a relatively low resistivity in a charged state. Further, a process of forming a semiconductor memory device, includes depositing a first gate oxide over a substrate having a trench and depositing a nitride over the first gate oxide, forming openings in the nitride down to the gate oxide, and depositing polysilicon over the nitride and etching first spacers in the polysilicon along the sidewalls of the openings in the nitride. A second polysilicon material is deposited over the first spacers and substrate and second spacers are formed in the second polysilicon material. A contact window is opened between first and second ones of the first spacers and a highly doped polysilicon is deposited in the contact window. A contact is formed over the highly doped polysilicon.

14 Claims, 6 Drawing Sheets

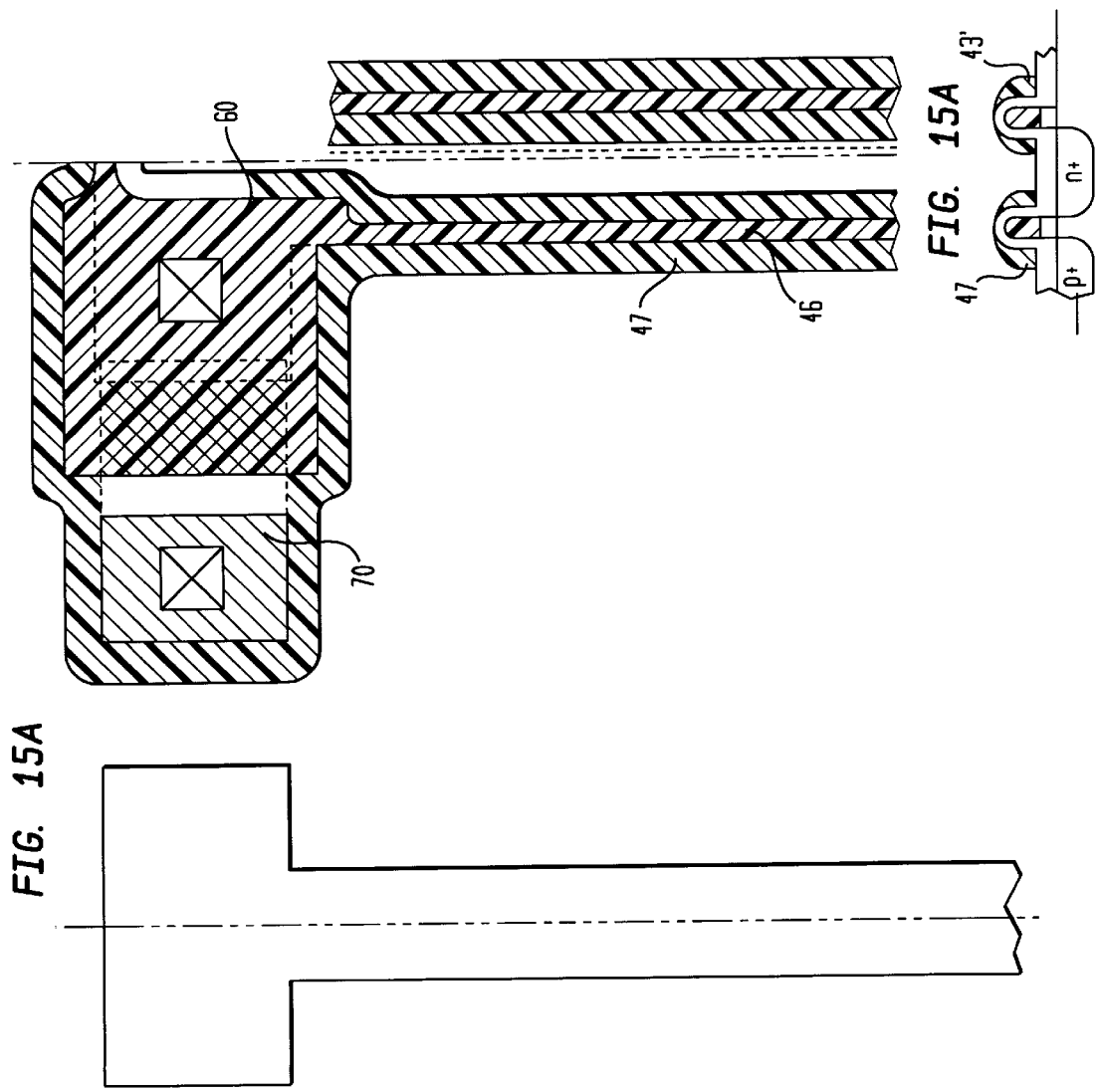

METHOD FOR FORMING DEEP DEPLETION MODE DYNAMIC RANDOM ACCESS MEMORY (DRAM) CELL

This is a division of application Ser. No. 08/556,522 filed Nov. 13, 1995, now abandoned.

BACKGROUND OF THE INVENTION

1. Field of the Invention

The present invention generally relates to a semiconductor memory device, and more particularly to a deep depletion mode dynamic random access memory (DRAM) cell and a method of making the DRAM cell utilizing spacer technology.

2. Description of the Related Art

Processes for forming dynamic random access memory (DRAM) circuits are complex and expensive. There are a plurality of conventional cell concepts typically employed. For example, the deep trench DRAM cell and the stacked DRAM cell are typically utilized, both of which store a specific amount of charge representing a predetermined logic state (e.g., a typical minimum charge is 30 fF/cell).

The charge is transferred by the transfer gate or word line and then is detected on bit lines and amplified.

An example of a conventional structure is shown in FIG. 3. More particularly, a semiconductor layer 32 is formed on a substrate 31. An insulating layer 33 is formed on the semiconductor layer 32.

A diffused layer 34 is formed at one end of the layer 33 and an electrode 35 of an information storage capacitor is provided at another end of the layer 34 opposed to the location of the region 34, thereby forming a capacitor 30. An interlayer insulating film 36 is formed to cover the electrode 35 of the capacitor 30. On upper surfaces of insulating film 36 and the insulating layer 33, a word line 37 in read-out and a gate electrode 38 of a metal oxide semiconductor field-effect transistor (MOSFET) are integrally formed, except on that portion of the layer 33 which corresponds to the diffused region 34.

The capacitor 30 has a constant voltage Vc applied thereto, while the electrical charge is transferred to the capacitor 30 upon conductance of the MOSFET. Then, an inversion layer or a deep depletion state is brought about at the surface of the semiconductor layer 32 in the capacitor 30 so that the width of a space charge layer may be controlled and a high speed operation may be achieved.

However, the above-mentioned conventional device has several significant drawbacks. First, such a device is constructed using conventional lithography techniques and thus the pitch is relatively large. Further, packing density is relatively low.

Another problem of the conventional DRAM structures is that conventional DRAM cells cannot be made smaller as a "state of the art" deep trench or stacked capacitor cell, which is approximately 0.5 $\mu m^2$ for a quarter micron technology.

Further, while the process for such a cell is made much simpler than for a conventional trench cell, the circuits for reading and writing of a dynamic memory cell are usually much more complex since there is an additional storage line (SL).

Thus, the conventional DRAM cell cannot be made smaller than a capacitor cell, and thus a dynamic memory cell results, which despite its simpler fabrication process, has no sufficient advantage compared to the well-established trench and stacked capacitor technologies.

SUMMARY OF THE INVENTION

It is therefore an object of the present invention to overcome the above problems of the conventional memory devices and to provide a semiconductor memory device, such as a DRAM cell, which does not utilize a capacitor or capacitance.

Another object of the present invention is to provide an inexpensive and fully scalable DRAM cell and a process of making the DRAM cell without a deep trench or stacked capacitor.

A further object of the invention is to provide a DRAM structure which can be made smaller, utilizing spacer technology.

According to a first aspect of the invention, a semiconductor memory device for receiving a charge, is provided which includes a substrate, a transfer gate overlying the substrate, means for storing coupled to the transfer gate, a deep depleted region formed in the substrate under the means for storing, and a bit line for initially receiving the charge, the substrate receiving the charge via the transfer gate, the substrate being highly resistive in a deep depletion mode, if no charge is stored therein, and having a low resistivity in a charged state.

With the invention, a very simple structure results which is easily manufactured in a manner similar to erasable programmable read-only memories (EPROMs). Moreover, the invention provides an inexpensive DRAM process, without a trench or stack process for forming the storage node. The inventive process is based on a new, fully scalable, cell concerning its functionality as well as its layout.

Further, in a second embodiment, spacer technology is employed by the present invention such that packing density is improved by using shallow trench isolation, and by generating the wordlines utilizing a spacer concept which allows two word lines to be generated which are less than one lithographic minimum feature size apart from each other. Thus, the structure can be made with less than half the pitch of the conventional lithographic techniques.

Further, the invention provides a scheme in which the wordlines can be trimmed and in which an electrical contact can be made to the wordlines via contact pads. Additionally, a self-aligned bit line contact may be made in the inventive structure.

BRIEF DESCRIPTION OF THE DRAWINGS

The foregoing and other objects, aspects and advantages will be better understood from the following detailed description of a preferred embodiment of the invention with reference to the drawings, in which:

FIGS. 15A–15B are a top view and a cross-section, respectively, of forming contacts 70 to the poly spacer 47 according to the present invention.

DETAILED DESCRIPTION OF A PREFERRED EMBODIMENT OF THE INVENTION

Figure 1:
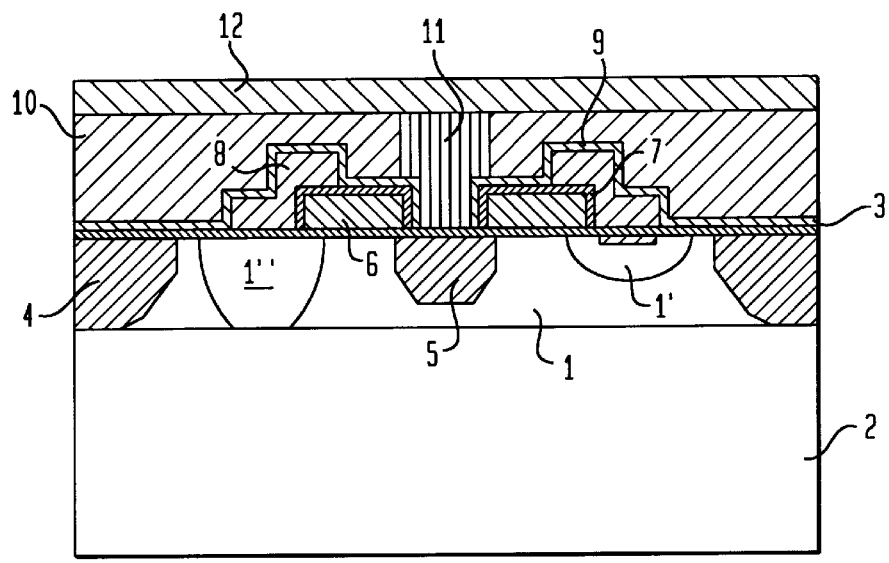
FIG. 1 is a cross-sectional view of a cell of a semiconductor memory device according to the present invention.
Figure 3:
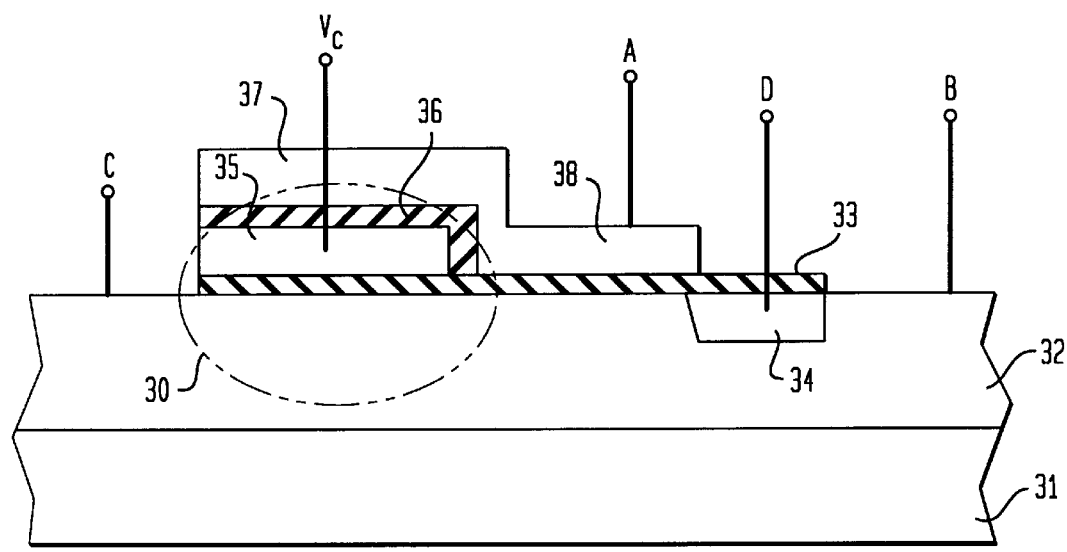
FIG. 3 is a cross-section view of a conventional semiconductor memory device structure.
Figure 2:
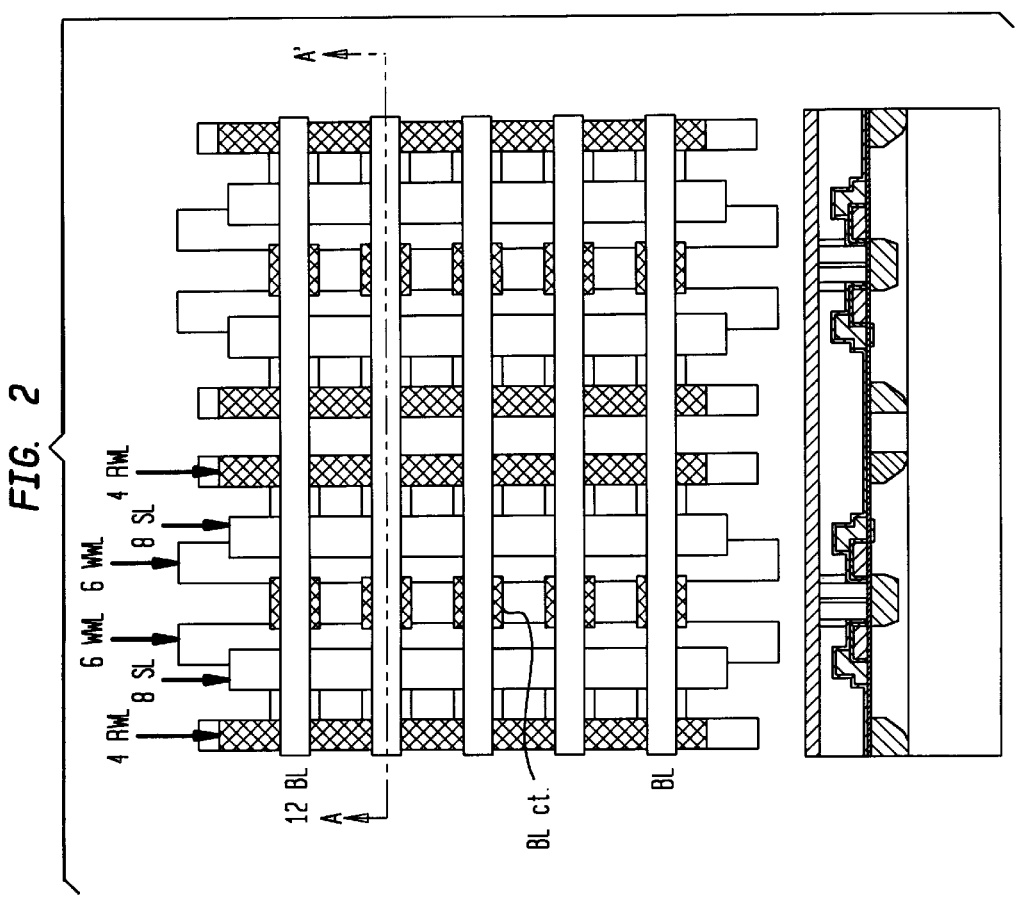
FIG. 2 is a cross-sectional view of a cell layout of the semiconductor memory device according to the present invention.

Referring now to the drawings, and more particularly to FIGS. 1–2, there is shown an embodiment of a semiconductor memory device according to the present invention, and more particularly to a deep depletion mode DRAM cell according to the present invention.

Generally, as shown in FIG. 1, a deep depletion memory cell according to the invention operates as a resistive element, depending on whether charge is stored or not. The amount of charge is far less than 1 fF and typically is on the order of substantially $0.2 \times 10^{-15}$ A/sec.

The charge stored leads to a low resistive n- or p-type semiconductor layer 1, as shown by the structure 1' on the right side of FIG. 1.

Otherwise, the semiconductor layer 1 is highly resistive in a deep depletion mode, if no charge is stored (e.g., see the structure 1" on the left side of FIG. 1). Semiconductor layer 1 is preferably formed from p-type semiconductor substrate material with a boron doping between $10^{16}$ to $10^{18}$ and has a thickness of preferably 0.1 to 0.5 µm.

The charge is stored via a transfer gate or writing word line (WWL) 6 into a deep depleted region 1" under the storage line (SL) 8 biased at a constant voltage (e.g., voltage level "high" or "1" for a p-type layer 1). The constant voltage is typically 2V, but may be suitably adjusted according to the designer's requirements and constraints. WWL 6 and storage line 8 are preferably formed from n+ poly silicon with phosphorous doping of approximately $3^{20}$ and a sheet resistance of about 30 ohms per square.

In operation, the charge initially enters the cell from a bit line (BL) 12, through a bit line contact 11, and thereafter passes through a bit line contact diffusion layer 5 into semiconductor layer 1. Layer 5 preferably comprises a layer formed of a dopant-type material opposite that of the semiconductor layer 1. Preferably, the dopant of layer 5 is arsenic (e.g., concentration of $10^{19}$ to $10^{20}$) and that of layer 1 is boron (e.g., concentration of $1^{16}$ to $1^{18}$).

Reading is made possible by a reading word line (RWL) 4 (e.g., an implanted and diffused semiconductor layer of the same dopant type as the semiconductor layer 1). The thickness of the reading word line 4 is preferably substantially the same as the semiconductor layer 1 but also may have another thickness depending on the designer's constraints and requirements.

The deep depleted semiconductor layer 1 is highly resistive, such that if a charge is stored, the depletion layer 1" "shrinks" into the built-in depletion layer 1' of the semiconductor in an inversion state.

Shrinkage of the depletion layer occurs through the well-known effect of building an inversion layer which means that the charges opposite to the polarity (+) of the storage line 8 are no longer provided by the fixed charges in the substrate 1 (e.g., negatively charged boron acceptors), but by the mobile surface charges of the inversion layer (electrons).

Thus, sensing of a "0" (e.g., meaning a low charge or a zero charge) would, for example, mean that the path between BL 12 and RWL 4 is highly resistive. Sensing is performed, for example, by sensing (measuring) the current between the RWL 4 and the BL 5 when a constant voltage of, for example, 2V is applied. However, the logic state, either a logical "0" or a "1" (e.g., above a predetermined charge), is not destroyed by the sensing procedure. A preferred write and read scheme is shown in Table 1 below, wherein "1" is a low resistive state, "0" is a high resistive state and SL is "high".

|         | RWL                      | WWL             | BL      |
|---------|--------------------------|-----------------|---------|
| write 0 | 0                        | high, then low  | high    |
| read 0  | $0 < V_{rwl} <$ high     | 0               | sensing |
| write 1 | 0                        | high, then low  | 0       |
| read 1  | $0 < V_{rwl} <$ high     | 0               | sensing |

The retention time $T_{ret}$ of the cell is believed to be on the order of seconds. A typical junction leakage current of 1 fA per cell area (A), which can be applied also for the deep depleted region leakage, would lead to a retention time of 10 seconds, according to the following equation:

$$T_{ret} = Q/I = (\epsilon \cdot \epsilon_0 \cdot V_{dd})/(tox \cdot j)$$

wherein j=I/A, Vdd=2.5V, tox=8 nm, and $\epsilon$, $\epsilon 0$ are the relative and vacuum dielectric constants, respectively.

The retention time $T_{ret}$ is independent of the deep depleted area and is therefore fully scalable. The retention time $T_{ret}$ depends mainly on trap free processing to suppress generation of minority carriers. Traps increase the leakage current I within the space charge region underneath the storage line 8, for example, via the well-known Frenkel-Poole mechanism.

The operation mode of this described cell is comparable to a junction FET (JFET) operation mode, which is well-known to one of ordinary skill in the art.

Turning now to the detailed fabrication of the inventive cell and referring to FIG. 1, the inventive DRAM process can be processed on an Semiconductor-On-Insulator (SOI) substrate with the substrate 2 as the buried isolating layer or on a semiconductor substrate 2 with a dopant of opposite type than the semiconductor layer 1. Examples of the dopant of substrate 2 are As, Ph, and/or Sb and those of layer 1 include boron ore gallium. The preferred material of substrate 2 is arsenic and the thickness of the substrate 2 is preferably 1 mm or 750 µm for 8-inch wafers.

In the case of a semiconductor substrate, a doping layer of a type opposite that of the bit line contact diffusion layer 5 may be required to form a well, in order to guarantee a potential contact to the well of the WWL 6 transistor.

Turning to the detailed process, a semiconductor layer 1 is deposited on a substrate 2 by ion implantation or preferably by epitaxy.

An active area is formed by anisotropic etching or the like and the semiconductor layer 1 is doped with boron as described above and has a thickness of 0.1 to 0.5 µm.

Thereafter, a transfer gate oxidation process is performed at a temperature between 700° C. and 1050° C. by oxidizing in an $O_2$ or $H_2O$ ambient atmosphere.

Then, deposition of a first polysilicon layer 3, preferably in a thickness of 100 to 400 nm, is performed.

In a next step, reoxidation and/or formation of an inter-layer dielectric is performed, followed by deposition of a second polysilicon layer.

The dielectric has a preferred thickness of 10 to 20 nm, whereas the second polysilicon layer has a preferred thickness of 100 to 400 nm. For the polysilicon deposition, a standard process using silane or disilane in a hydrogen atmosphere with a phosphine as a dopant gas can be used. The deposition temperature may range between 500 to 700° C. depending on whether disilane or silane is used as silicon source. Pressure during deposition is preferably between 10 to 200 torr, and more preferably is approximately 80 torr.

Then, a nitride etch stop deposition is performed and a spacer (e.g., having a thickness of 200 nm) is formed. Thereafter, (reading word line) layer 4 is doped with ion implantation and an interlayer dielectric 10 is formed by chemical vapor deposition (CVD), for example, tetraethylorthosilane (TEOS).

A self-aligned bit line contact 11 is formed by anisotropic etching using the nitride layer 9 as an etch stop and thereafter and thereafter a bit line process occurs by filling the bitline contact hole 11 with a highly doped polysilicon plug 11 (doped with arsenic $10^{20}$) and planarizing the surface afterwards down to layer 10 to form a bit line 12 on top of it.

Finally, a back end process is performed by making contact of the storage lines, word lines and bit lines with the sense amplifiers and address decoders in the periphery.

Variations of the above structure and process are possible so as to to combine the basic cell process described above with a complementary metal oxide semiconductor (CMOS) process. In the inventive process, there is only one additional layer (e.g., the second polysilicon layer) required, as compared to standard complementary metal oxide semiconductor (CMOS) processes.

For example, stacking of the RWL and the WWL is possible without increasing the cell size and ensuring high performance.

With this aspect of the invention, a semiconductor memory device (e.g., a DRAM cell) is provided which does not utilize capacitance and which is inexpensive and fully scalable. Further, the process of making the DRAM cell does not include forming a deep trench or stack capacitor therewith.

Thus, the invention provide a very simple structure results which is easily manufactured in a manner similar to erasable programmable read only memories (EPROMs). The invention allows an inexpensive DRAM process, without a trench or stack process forming the storage node.

Referring to FIG. 2, the layout of the cell is shown in which an array of these cells is drawn. One bit line contact (BL ct.) supports two SLs 8 via the WWL 6. Two RWLs 4 for each side form the left and right boundaries of the cell.

The cells are isolated via, for example, shallow trench isolation (e.g., the lower and upper boundaries shown in FIG. 2). The cell size is comparable to the other state of the art cell technologies (e.g., 0.5*1.1 $\mu m^2$ for a trench technology with 0.25 $\mu m$ design rules.

The above embodiment of the invention may be modified such that a cell may be provided in which the SL 8 is replaced with a highly doped junction self-aligned to the WWL 6 on the opposite side of, but with the same dopant type as the BL contact diffusion layer 5.

In yet another embodiment of the invention, a DRAM cell is provided utilizing spacer technology and which can be made smaller as a state of the art deep trench or stacked capacitor cell (e.g., approximately 0.5 $\mu m^2$ for a quarter micron technology).

This embodiment of the invention provides a dynamic memory cell which has well-defined advantages compared to the well-established trench and stacked capacitor technologies.

Specifically, the present inventors have found that if "state of the art" spacer technology is employed for printing the capacitor gate line and the writing word line (WWL), the cell area can be shrunk by a factor of approximately two or more compared to standard technologies. The process flow is explained below with reference to FIGS. 4–11.

Figure 4:
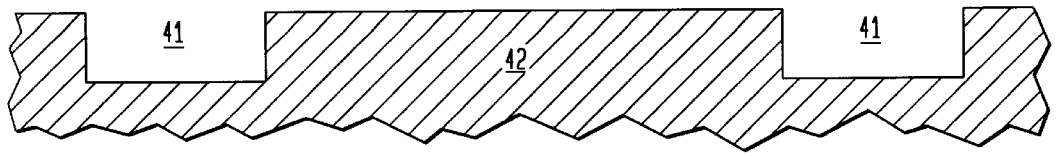
FIGS. 4–11 illustrates process steps according to the inventive method of the present invention for providing a DRAM cell utilizing spacer technology.

Referring to FIG. 4, a first lithography step is performed and thereafter a shallow trench isolation (STI) 41, using the minimum feature size (typically 0.25 $\mu m$ for quarter micron technology), is etched into a silicon substrate 42 (e.g., typically p-type with a doping between $1^{16}$ and $1^{17}$). The substrate preferably has a thickness of 750 $\mu m$ for 8-inch wafers.

Figure 5:
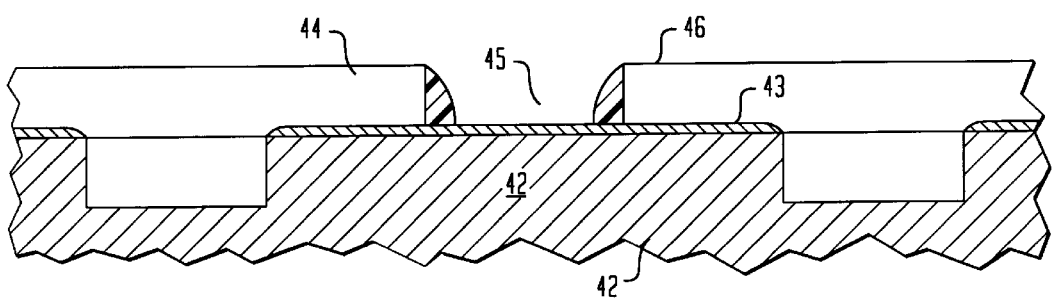

Thereafter, as shown in FIG. 5, the STI (shallow trench isolation) 41 is planarized, preferably by chemical-mechanical polishing (CMP), and a first gate oxidation 43 is performed. The gate oxide 43 is preferably $SiO_2$ and preferably has a thickness of 8 nm.

Thereafter, a nitride 44, such as CVD nitride, is deposited over the gate oxide 43 in a preferred thickness of 100 to 400 nm.

In a second lithography step, windows 45 are formed with a minimum feature size and are opened in the nitride 44 down to the gate oxide 43.

Thereafter, polysilicon is deposited and after a third lithographic step polysilicon spacers 46 are etched along the sidewalls of the openings in the nitride 44. The third lithography step is for forming the electrical contact pads for the polysilicon spacers 46 at the periphery (e.g., see FIGS. 13–15 described below) of the structure. The polysilicon spacers 46 will later become the Writing Word Lines (WWL).

Figure 6:
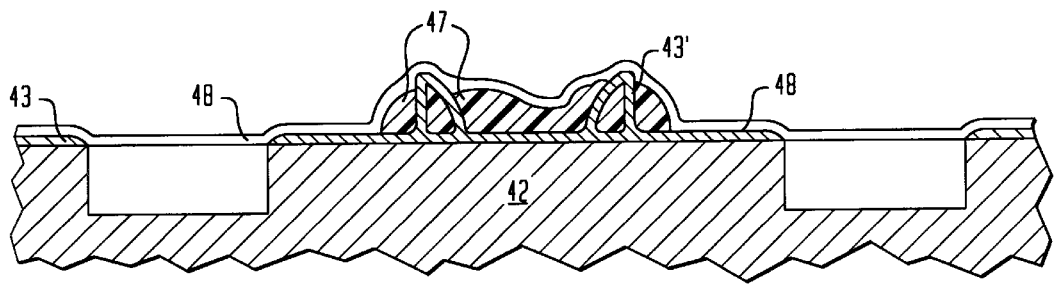

In FIG. 6, the nitride 44 is removed by wet etching selectively to the gate oxide 43, followed by etching off the gate oxide 43 also in a defined step. Then, the polysilicon spacer 46 and the silicon substrate 42 are oxidized again with an oxide 43' followed by a second polysilicon deposition.

After a fourth lithography step, an outside polysilicon spacer 47 is etched along the oxidized polysilicon spacer 46. During this step, there is also an inside spacer (unreferenced) formed between the two spacers 46.

If the distance between the two spacers 46 is too close (e.g., less than 150 nm), they may form a continuous polysilicon stud. For typical dimensions (e.g., a spacer distance of approximately 150 nm and a spacer width of approximately 50 nm), this is very likely to happen. The fourth lithography step is needed for printing the contact pad for the polysilicon spacer 47 which will later become the capacitor gate of the structure.

Finally, on top of the spacer structure and all across the wafer, a nitride liner 48 is deposited, preferably having a thickness of 5 to 50 nm, which will serve as an etch stop in the following steps. The nitride liner 48 preferably is formed of CVD nitride.

Figure 7:
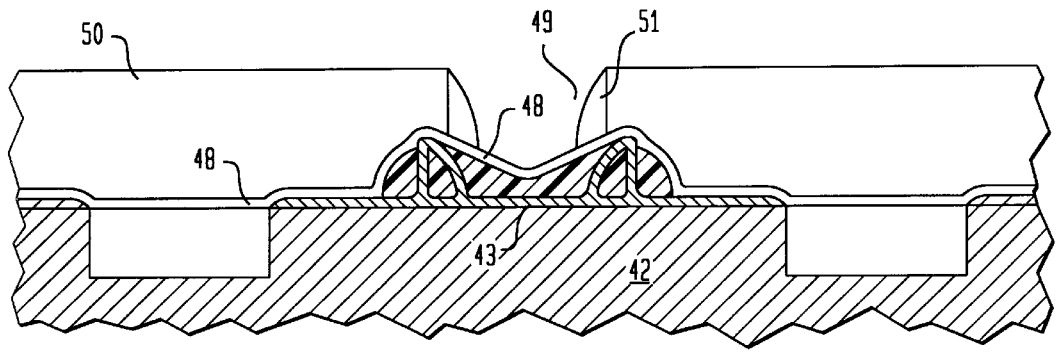

Referring to FIG. 7, a chemical vapor deposition (CVD) oxide 50 is deposited and planarized to a preferred dimension of 400 to 500 nm.

After planarization and a fifth lithographic step, a contact window 49 is opened between the two poly spacers 46 using the nitride liner 48 as an etch stop during an anisotropic etch process. The width of this contact window preferably is substantially the same as that of the minimum feature size (e.g., such as 0.25 $\mu m$ for quarter micron technology).

To ensure that the poly spacers 46 are covered by CVD oxide in the process steps to follow, the contact window 49 is narrowed by an oxide sidewall spacer 51 having a thickness substantially the same as that of the polysilicon spacer 46.

Figure 8:
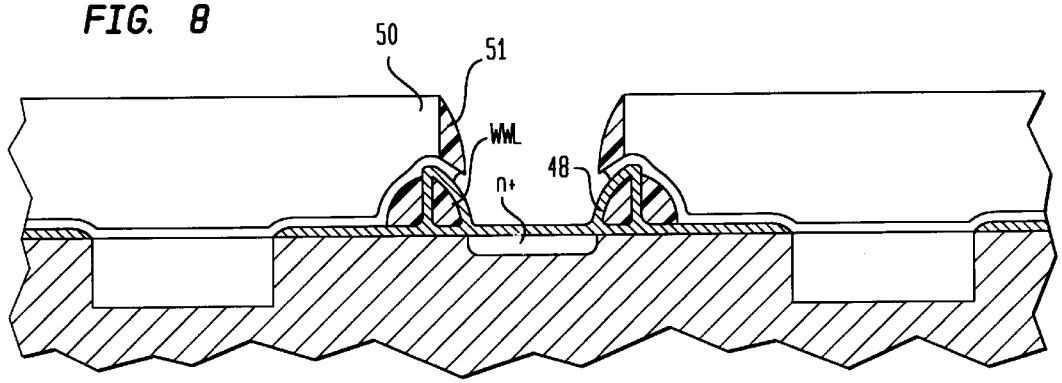

In FIG. 8, the nitride liner 48 and the inner polysilicon spacer 47 are removed by wet etching with, for example, phosphoric acid and cholin for the nitride liner and the polysilicon, respectively. Both are selective to oxide and stop on the surface of gate oxide 43, as shown in FIG. 8. Gate oxide 43 is used as a sacrificial oxide for the n$^+$ implantation of the bitline contact.

Figure 9:
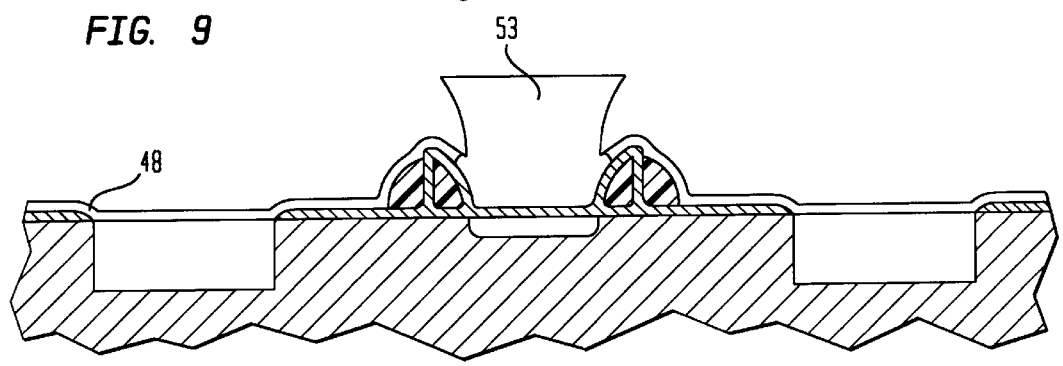

As shown in FIG. 9, after a junction annealing operation which is preferably performed by rapid thermal annealing (RTA), the sacrificial oxide is removed by anisotropic etching and highly doped polysilicon 53 is deposited for the bitline contact so as to have a preferred thickness of approximately 300 nm.

After planarization of the polysilicon 53, all of the CVD oxide 50 is removed by, for example, wet etching in HF, using the nitride liner 48 again as an etch stop.

Figure 10:
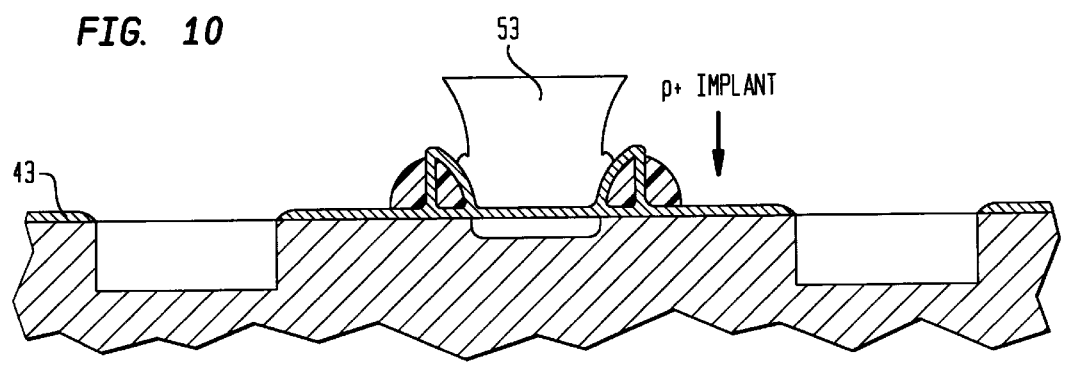

In FIG. 10, the nitride liner 48 is removed selectively to gate oxide 43 and a p$^+$ implantation is performed by gas phase diffusion doping or epitaxy to generate the Reading Word Line (RWL).

Figure 11:
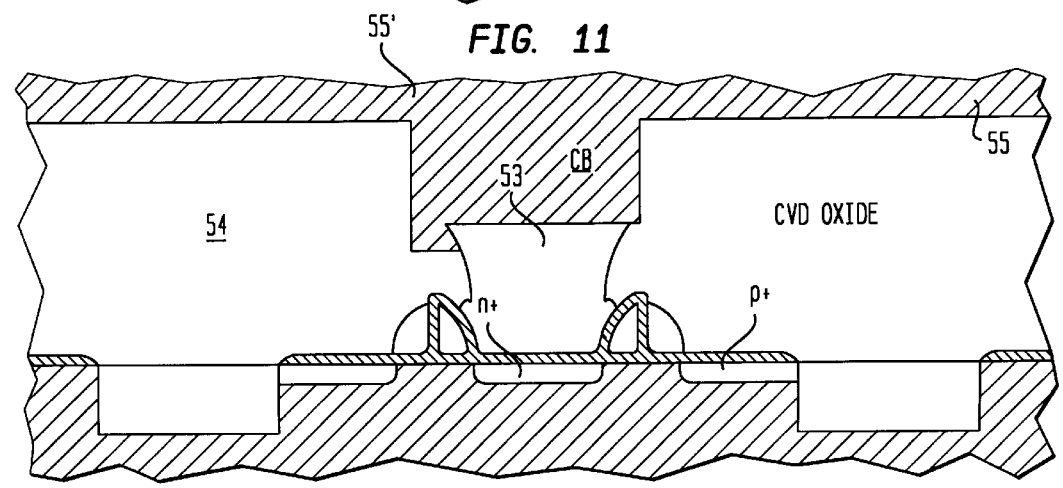

In FIG. 11, a CVD oxide 54, such as CVD TEOS, is deposited and planarized and in a sixth lithographic step the contact-bitline (CB) contact is opened down to the polysilicon stud and a metal contact 55, preferably formed of tungsten, is made to the zero metallization level.

Figure 12:
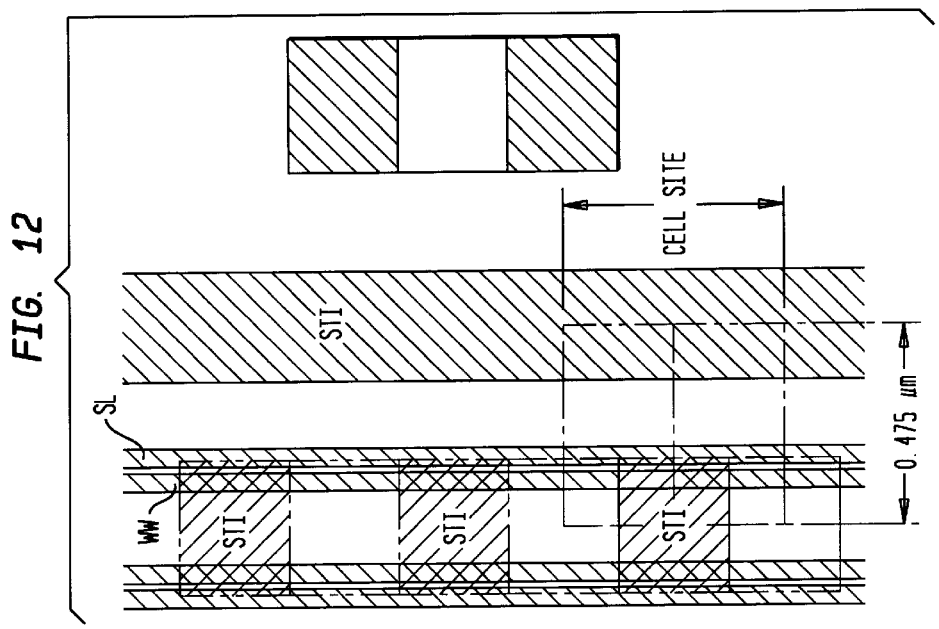
FIG. 12 is a top view of the cell layout produced by the process of FIGS. 4–11.

FIG. 12 illustrates a top view of the cell layout together with exemplary dimensions for a quarter micron technology, showing that a cell size of 0.5 $\mu$m×0.5 $\mu$m (0.25 $\mu$m$^2$) is possible with the present invention utilizing the spacer technology.

Figure 13:
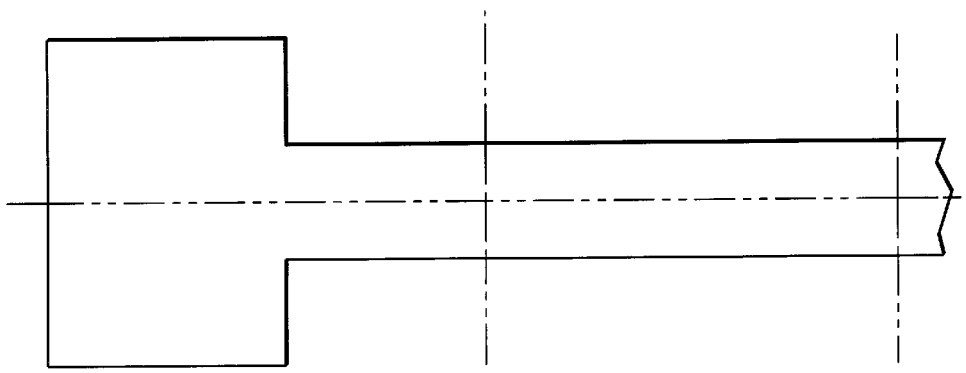
FIG. 13 illustrates how contacts are made to the poly gate 46.

FIG. 13 and FIGS. 15A–15B illustrate how contacts to the poly gates 46 and 48 can be made in the periphery.

Figure 14A:
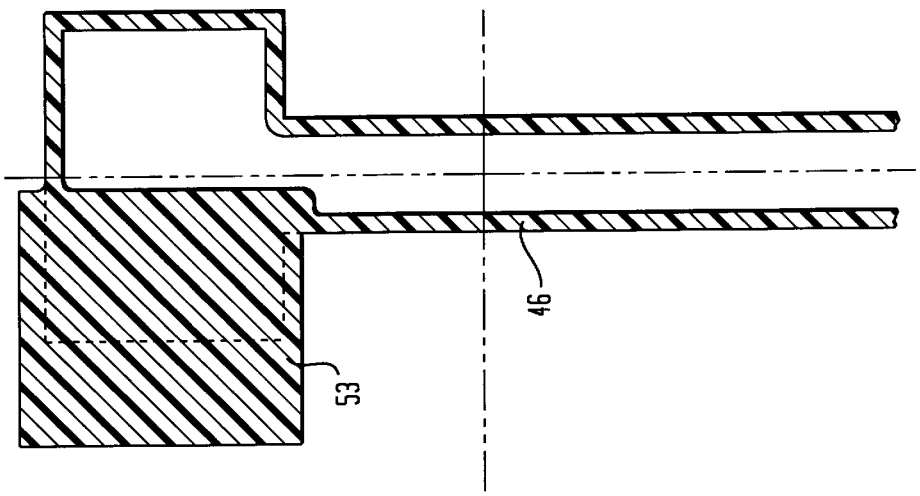
FIG. 14A illustrates a top view of the structure of the contact pad 60 for poly spacer 46 formed with a third lithographic step together with a spacer.
Figure 14B:
FIG. 14B is a cross-section of the structure of FIG. 14A.

FIG. 13 corresponds to the nitride window of FIG. 5 which is printed with a larger pitch in the periphery to leave room for trimming of the spacers. The contact pad 60 for poly spacer 46 is formed with the third lithographic step together with the spacer, as shown in FIG. 14A which illustrates a top view of the structure and FIG. 14B which illustrates the cross-section of the structure.

The same technique is applied in FIGS. 15A–15B, which illustrate a top view and a cross-section of the structure to form the contact pad 70 for poly spacer 48 after poly spacer 46 has been oxidized to insulate the two gates.

Finally, in another lithographic step, the spacer edges are trimmed to electrically disconnect the gates of two adjacent cells. Preferably, the spacer edges are trimmed by anisotropic etching.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A process of forming a semiconductor memory device, comprising:
   depositing a first gate oxide over a substrate having a trench and depositing a nitride over the first gate oxide;
   forming openings in the nitride down to the gate oxide;
   depositing polysilicon over said nitride and etching first spacers in said polysilicon along sidewalls of the openings in the nitride;
   depositing a second polysilicon material over said first spacers and substrate and forming second spacers in said second polysilicon material, said second spacers being formed outwardly of said first spacers;
   opening a contact window between first and second ones of said first spacers and depositing a highly doped polysilicon in said contact window; and
   forming a contact over said highly doped polysilicon.

2. A process according to claim 1, further comprising a step of trimming edges of said first and second spacers to electrically disconnect gates of adjacent first and second devices, said first spacers forming a writing word line (WWL).

3. A process according to claim 1, a step of oxidizing said first spacers and said substrate prior to said step of depositing said second polysilicon material.

4. A process according to claim 1, further comprising:
   prior to said step of forming said contact, a step of performing a p$^+$ implantation to said oxide on said substrate to generate a Reading Word Line (RWL).

5. A process according to claim 4, further comprising:
   depositing a second oxide and opening a contact-bitline contact to the highly doped polysilicon in said contact window.

6. A process according to claim 1, wherein said step of forming a contact over said highly doped polysilicon comprises forming a metal contact over said highly doped polysilicon to a zero metallization level.

7. A process according to claim 1, wherein said second spacers are etched along the oxidized first spacers.

8. A process according to claim 1, wherein a device produced by said process has a size of 0.25 $\mu$m$^2$.

9. A process according to claim 1, wherein adjacent ones of said word lines have a distance therebetween of less than one minimum feature size.

10. A process according to claim 1, wherein said step of opening said contact window is performed such that said contact window has a width of a minimum feature size.

11. A process of forming a memory, the process comprising steps of:
   depositing a nitride over a first gate oxide on a substrate;
   depositing polysilicon over said nitride and etching first spacers in said polysilicon;
   removing said nitride selectively to the gate oxide and thereafter etching off the gate oxide;
   oxidizing said first spacers and said substrate, and thereafter depositing a second polysilicon material thereover;
   printing a contact pad for second spacers and forming second spacers in said polysilicon, said second spacers being formed outwardly of said first spacers and said second spacers being etched along the oxidized first spacers;
   opening a contact window between the first and second ones of said first spacers;
   forming a contact-bitline (CB) contact and performing an ion implantation to generate a Reading Word Line (RWL);
   depositing a CVD oxide, opening the CB contact, and making a metal contact; and trimming edges of said first and second spacers to electrically disconnect gates of first and second adjacent cells.

12. A process according to claim 11, further comprising steps of:

etching a trench in said substrate; and planarizing said shallow trench isolation prior to said step of depositing said nitride, wherein said second spacers form a capacitor gate of said semiconductor device.

13. A process according to claim 11, further comprising forming openings in the nitride down to the first gate oxide, wherein said step of etching first spacers in said polysilicon includes etching said first spacers in said polysilicon along sidewalls of the openings in the nitride.

14. A process according to claim 11, further comprising depositing a nitride liner over said second spacers;

depositing an oxide over said nitride liner and planarizing said oxide;

narrowing said contact window by providing an oxide sidewall spacer having a thickness substantially the same as that of the first spacers; and removing the nitride liner and the third spacer.

\* \* \* \* \*